United States Patent [19]

Shibata et al.

[11] Patent Number: 4,987,466
[45] Date of Patent: Jan. 22, 1991

[54] SOLID STATE IMAGE SENSOR

[75] Inventors: Hidenori Shibata, Yokohama; Mamoru Iesaka, Kawasaki; Shinji Oosawa, Inagi, all of Japan

[73] Assignee: Kabushiki Kaisha Toshiba, Kawasaki, Japan

[21] Appl. No.: 362,664

[22] Filed: Jun. 7, 1989

[30] Foreign Application Priority Data

Jun. 7, 1988 [JP] Japan .................................. 63-139947
Aug. 23, 1988 [JP] Japan .................................. 63-208610

[51] Int. Cl.$^5$ ...................... H01L 29/78; H01L 27/14; H01L 31/00; G11C 19/28
[52] U.S. Cl. .......................................... 357/24; 357/30; 377/60
[58] Field of Search .................. 357/24, 30; 377/57-63

[56] References Cited

U.S. PATENT DOCUMENTS

| | | | |
|---|---|---|---|
| 4,064,524 | 12/1977 | Hagiwara et al. | 357/24 LR |
| 4,133,099 | 1/1979 | Hagiwara | 357/24 R |
| 4,242,692 | 12/1980 | Hagiwara | 357/24 R |
| 4,807,037 | 2/1989 | Iesaka et al. | 357/24 LR |
| 4,821,081 | 4/1989 | Hynecek | 357/24 M |

Primary Examiner—Gene M. Munson
Attorney, Agent, or Firm—Oblon, Spivak, McClelland, Maier & Neustadt

[57] ABSTRACT

A solid state image sensor includes a plurality of charge storage elements arranged in a matrix form on a semiconductor substrate, vertical CCDs arranged in a plurality of columns along the arrangement of the charge storage elements on the semiconductor substrate, for reading out signal charges stored in the charge storage elements, and a plurality of horizontal CCDs arranged in parallel on the substrate and extending in a direction perpendicular to the vertical CCDs, for individually transferring signal charges of each row supplied from the vertical CCDs in a horizontal direction. A channel through which the signal charge passes at the time of transfer of the signal charge between the horizontal CCDs is made wider on the signal charge output port side than on the signal charge input port side.

24 Claims, 10 Drawing Sheets

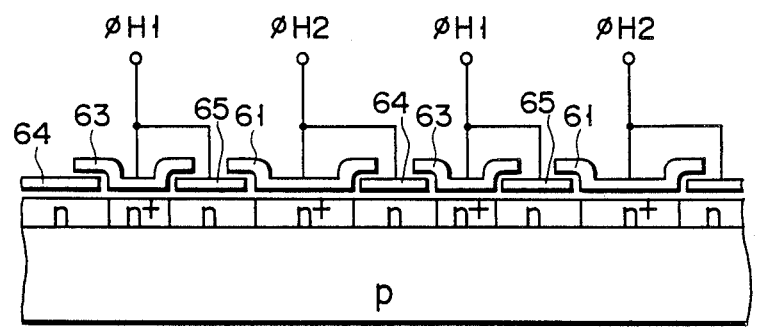
F I G. 10B

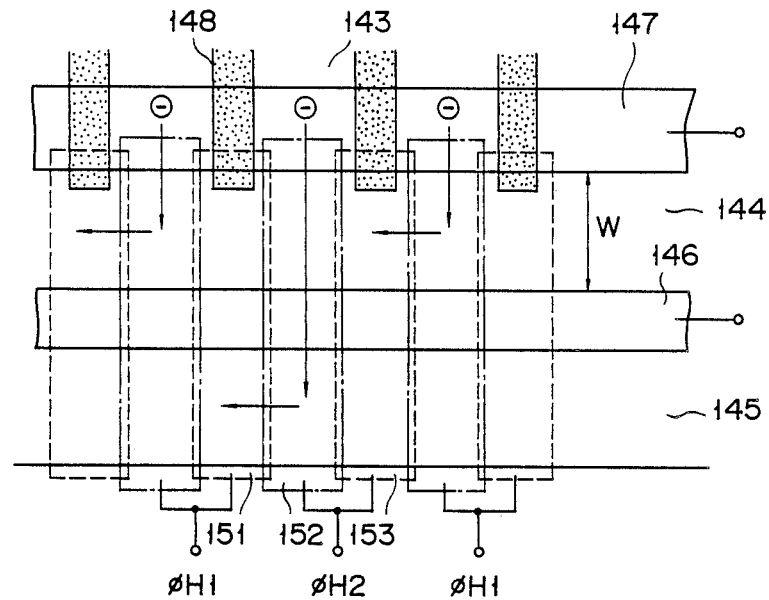
F I G. 11
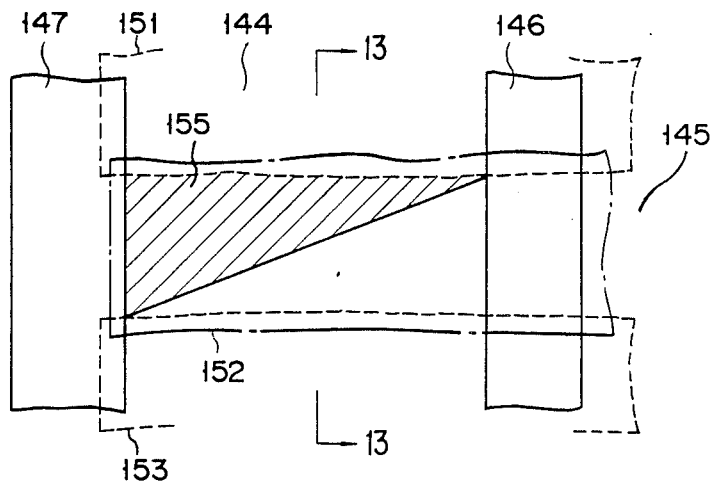
F I G. 12

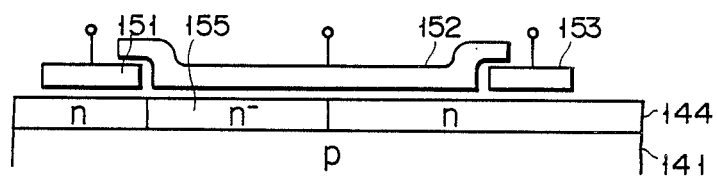
F I G. 13
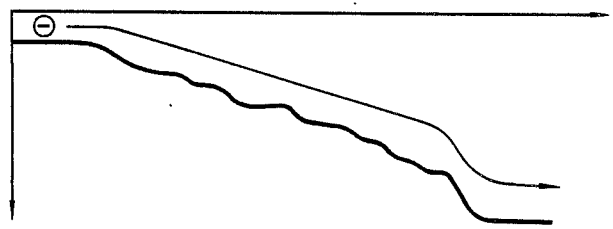
F I G. 14
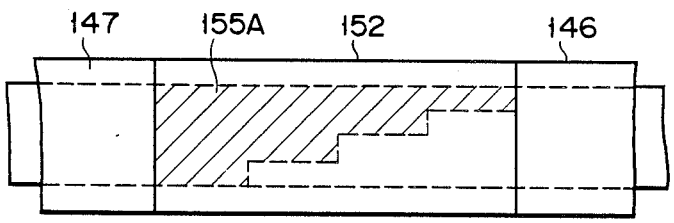
F I G. 15
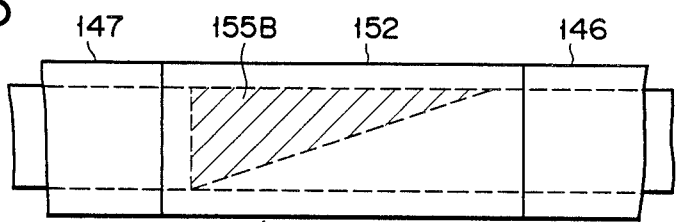
F I G. 16
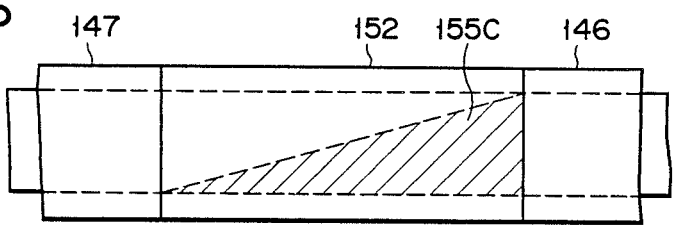
F I G. 17

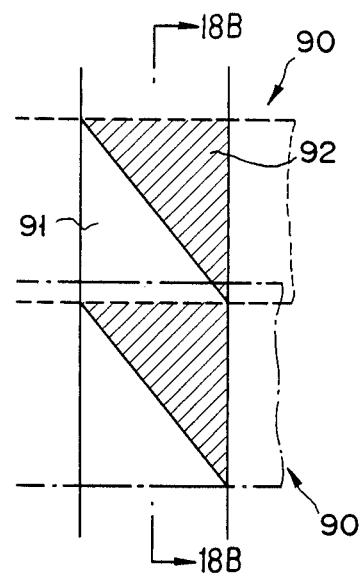
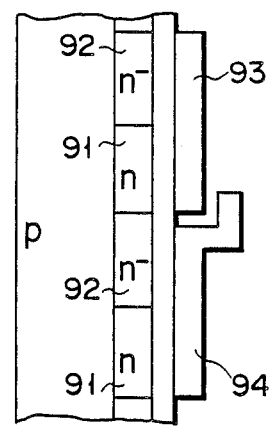
F I G. 18A    F I G. 18B
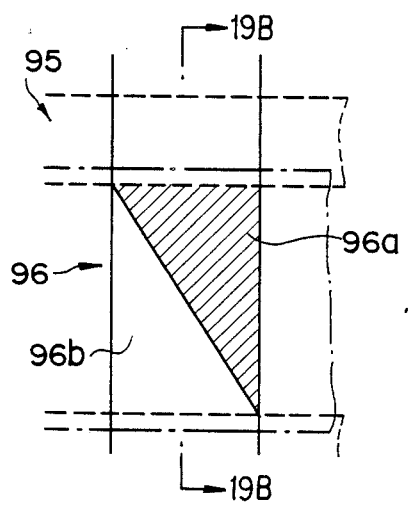
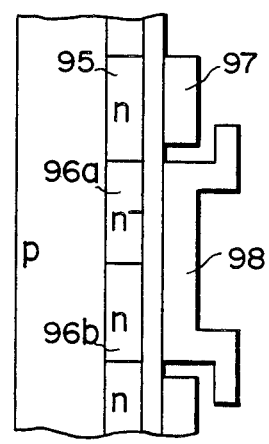
F I G. 19A    F I G. 19B

SOLID STATE IMAGE SENSOR

BACKGROUND OF THE INVENTION

1. Field of the Invention

This invention relates to a solid state image sensor having a plurality of horizontal CCDs, and more particularly to a solid state image sensor in which the charge transfer between horizontal CCDs is improved.

2. Description of the Related Art

Recently, CCD image sensors have been widely used for home-use video cameras and the like and also used for broadcasting cameras. The advent of VHS systems such as the super VHS system (S-VHS system) for home-use video cameras and the HDTV system for the TV broadcasting increasingly requires the development of multi-picture element type solid state image sensors The number of picture elements is determined to be approximately 500 and 1000 in the S-VHS and HDTV systems, respectively, and therefore an attempt has been made to increase the integration density of picture elements in the horizontal direction so as to increase the total number of picture elements.

With an increase in the number of picture elements in the horizontal direction, the readout frequency of a signal output and the driving frequency of the horizontal CCD were increased so that the power for driving the CCD could be increased and the transfer efficiency in the horizontal CCD could be lowered in an image sensor using a single horizontal charge transfer CCD. In order to solve the above problems, a solid state image sensor having a plurality of horizontal CCDs and disclosed, for example, in an article ("½ inch 768×492 elements CCD image sensor" TV technical report, February 1986, TEBS 109 ED942) has been proposed.

In the conventional solid state image sensor using two horizontal CCDs, photodiodes acting as a photosensitive section are arranged in a matrix form on a semiconductor substrate and vertical charge transfer CCDs or vertical CCDs are arranged adjacent to respective vertical lines of photodiodes. The vertical CCD is driven by four-phase drive signals supplied via four sets of electrodes in a four-phase driving manner. Two horizontal CCDs constituting one stage for adjacent two lines of vertical CCDs are arranged in parallel, and two horizontal CCDs are respectively connected to output amplifiers. Further, two electrodes for matching the timings of charge transfer between the vertical CCD and horizontal CCD are disposed between the vertical CCD and horizontal CCD, and an electrode for transferring the charge between the horizontal CCDs is arranged between the two horizontal CCDs.

With the above solid state image sensor, signal charges stored in the photodiodes for a preset period of time are read out to the corresponding vertical CCDs and then transferred in a vertical direction. The signal charges transferred by the adjacent two vertical CCDs are transferred to one of the horizontal CCDs via the electrode which is supplied with drive signal $\phi$VL. Those signal charges which are transferred along one of the vertical CCDs are further transferred to the other horizontal CCD via the electrode which is supplied with drive signal $\phi$T. The signal charges which have been transferred along the adjacent vertical CCDs and supplied to the respective two horizontal CCDs are separately transferred in a horizontal direction along the respective horizontal CCDs and output from the output amplifiers.

The above solid state image sensor has the following problem. That is, the electrode lying on the channel acting as a path for the charges at the time of transferring charges between two horizontal CCDs is formed in a rectangular form, and if the electrode is formed of polysilicon, burrs or indentations of 2000 Å are formed on the peripheral portion of the electrode. As a result, variation in the width (length in a horizontal direction) of each electrode becomes approximately 4000 Å at maximum. The variation in the electrode width changes the potential of the channel through which signal charges pass. More specifically, when the electrode is made wider, the channel potential becomes higher, and when it is made narrower, the channel potential becomes lower. For example, assume that the the electrode width is L and projections of 2000 Å are formed on both sides of the central portion thereof. Then, the electrode width of the central portion becomes (L+4000 Å). As a result, the channel potential at the portion of 4000 Å electrode width becomes higher than the channel potential at the other portion by $\Delta$V. In this case, if L is 4 $\mu$m, $\Delta$V becomes approximately 50 mV. That is, $\Delta$V becomes higher than the thermal excitation voltage (the potential difference of a potential barrier which electrons can pass by thermal excitation) of approximately 25 mV. As a result, a portion (which is referred to as a potential pocket) at which the potential is higher than the other portion is partially created in the channel under the electrode, and the charge in the channel cannot be completely transferred. When picture element signals obtained by the incomplete charge transfer is displayed on the CRT, irregular vertical lines are displayed on the display screen, thus degrading the picture quality.

SUMMARY OF THE INVENTION

An object of this invention is to provide a solid state image sensor in which incomplete charge transfer between horizontal CCDs can be prevented and by which picture images free from degradation of picture quality due to vertical lines can be obtained.

According to this invention, there is provided a solid state image sensor in which the channel width or the amount of doped impurity is set so that the channel potential of the signal charge output port is higher than that of the signal charge input port at the time of transferring signal charges between horizontal CCDs.

According to this invention, there is provided a solid state image sensor which comprises a plurality of charge storage elements arranged in a matrix form on a semiconductor substrate; vertical CCDs arranged in a plurality of columns along the arrangement of the charge storage elements on the semiconductor substrate, for reading out signal charges stored in the charge storage elements; and a plurality of horizontal CCDs arranged in parallel on the substrate and extending in a direction perpendicular to the vertical CCDs, for individually transferring, in a horizontal direction, signal charges of each row supplied from the vertical CCDs; wherein a channel through which the signal charge passes is made wider on the signal charge output port side than on the signal charge input port side.

According to this invention, the channel through which the signal charge passes is formed to have different amounts of impurity doped therein so that a charge potential of the signal charge input port is higher than that of the signal charge output port.

Further, according to this invention, the channel through which the signal charge passes is made wider in the signal charge output port than in the signal charge input port and is formed to have different amounts of impurity doped therein so that a charge potential of the input port is higher than that of the output port.

In the solid state image sensor of this invention, an electrode is formed so that the channel through which the signal charge passes is wider in the signal charge output port than in the signal charge input port. When the channel is made wider towards the output port, a potential gradient can be attained such that the potential becomes higher in a direction of charge transfer between the horizontal CCDs. Therefore, the potential pocket due to the burrs or indentations of the electrode can be compensated for by the potential gradient, making it possible to completely transfer the signal charge in the operation of transferring charges between the horizontal CCDs. In other words, incomplete transfer will not occur at the time of signal charge transfer between the horizontal CCDs and it becomes possible to reproduce good picture images which are free from the quality degradation due to vertical lines.

The channel potential can be changed to attain the potential gradient as that described above with the amount of impurity to be doped being controlled instead changing the channel width. Also, in this case, it is possible to completely transfer signal charges the horizontal CCDs. Further, the complete charge transfer between the horizontal CCDs can more reliably attained with the channel and the amount of impurity to be doped being controlled.

BRIEF DESCRIPTION OF THE DRAWINGS

FIG. 10B is a sectional view along line 10B—10B of FIG. 10A;

FIG. 11 is an enlarged view of a horizontal register section of a solid state image sensor according to another embodiment of this invention;

FIG. 12 is a diagram showing a region in which impurity is ion-implanted in the channel region of FIG. 11;

FIG. 13 is a cross sectional view along line 13—13 of FIG. 12;

FIG. 14 is a diagram showing the potential gradient of a horizontal register;

FIGS. 15 to 17 are diagrams showing channel regions in which impurity is ion-implanted with different patterns.

FIG. 18A is a diagram showing a vertical register;

FIG. 18B is a cross sectional view along line 18B—18B of FIG. 18A;

FIG. 19A is a diagram showing a vertical register according to another modification; and FIG. 19B is a cross sectional view along line 19B—19B of FIG. 19A.

DETAILED DESCRIPTION OF THE PREFERRED EMBODIMENTS

Figure 1:
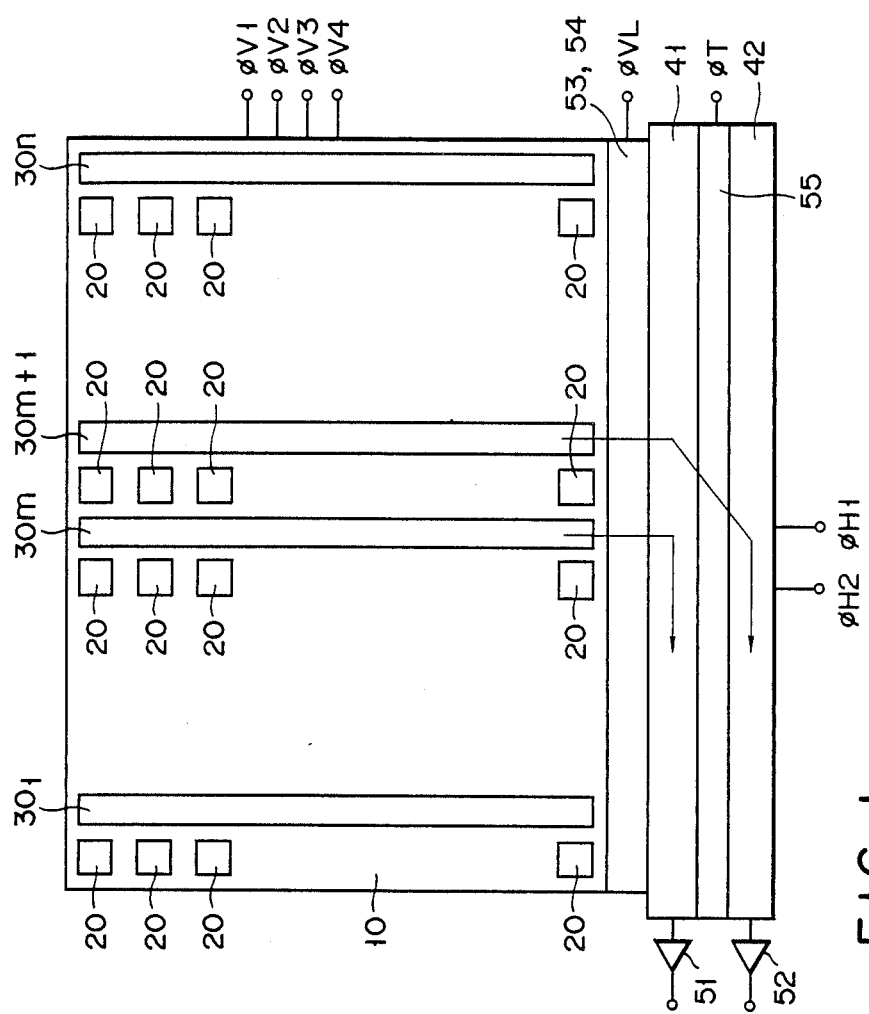
FIG. 1 is a plan view of an solid state image sensor according to one embodiment of this invention.

In the solid state image sensor of FIG. 1, a plurality of photodiodes 20 constituting a photosensitive section are arranged in a matrix form on semiconductor substrate 10. A plurality of vertical charge transfer CCDs, that is, vertical CCDs $30_l$ to $30_m$, $30_{m+l}$ to $30_n$ are arranged adjacent to the respective vertical lines (columns) photodiodes 20. The vertical CCDs have four sets of electrodes to be supplied with drive signals $\phi V1$ to $\phi V4$ and are driven in a four-phase driving manner. Horizontal CCDs 41 and 42 constituting one stage for each set of two adjacent columns of vertical CCDs such as vertical CCDs $30_m$ and $30_{m+l}$ are arranged on the output side of the vertical CCDs. Two horizontal CCDs are connected to output amplifiers 51 and 52, respectively. Electrodes 53 and 54 for setting the timings for transferring the charges from the vertical CCDs to the horizontal CCDs are provided between a group of vertical CCDs $30_l$ to $30_m$, $30_{m+l}$ to $30_n$ and a group of horizontal CCDs 41 and 42. Further, electrode 55 for controlling the charge transfer between the horizontal CCDs is provided between two horizontal CCDs 41 and 42.

Figure 2:
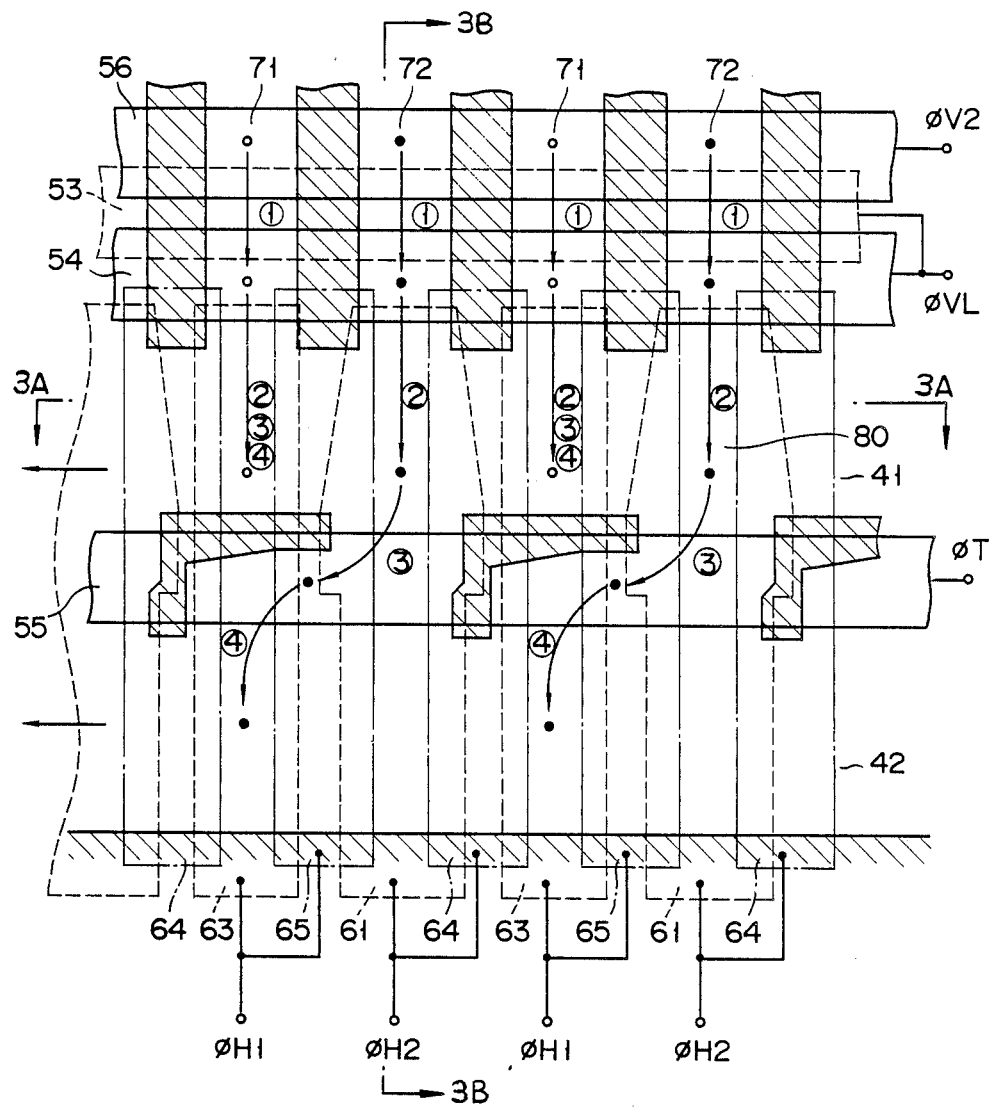
FIG. 2 is an enlarged diagram of a horizontal section shown in FIG. 1.

FIG. 2 shows the construction of the horizontal transfer section. In FIG. 2, the solid lines indicate electrodes of the first layer, the broken lines indicate electrodes of the second layer and the one-dot-dash lines indicate electrodes of the third layer. The hatched portions are element isolation regions.

Figure 3A:
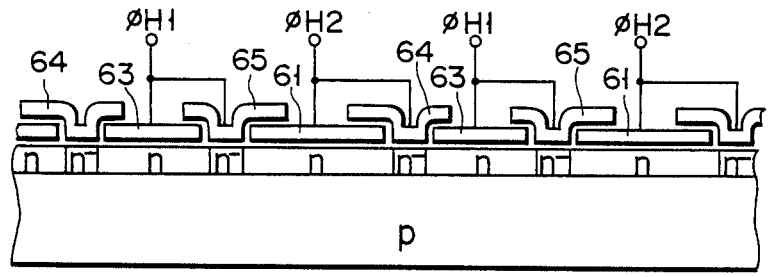
FIG. 3A is a sectional view along line 3A—3A of FIG. 2.
Figure 3B:
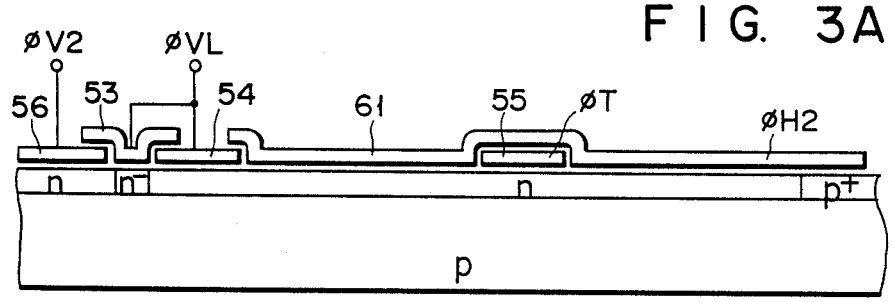
FIG. 3B is a sectional view along line 3B—3B of FIG. 2.

In this example, horizontal CCDs 41 and 42 are driven in a two-phase driving manner, and therefore four different kinds of electrodes, that is, electrodes 61 and 63 (second layer electrodes are used as shown in FIGS. 3A and 3B) formed over channel regions (n-type regions having an impurity concentration of $1.0 \times 10^{17}$ cm$^{-3}$) for temporarily storing charges at the time of transferring charges in the horizontal direction and electrodes 64 and 65 (third layer electrodes are used as shown in FIGS. 3A and 3B) formed over channel regions (n$^-$-type regions having an impurity concentration of $8.0 \times 10^{16}$ cm$^{-3}$) acting as barriers at the time of transferring charges in the horizontal direction are provided. In this case, electrodes 61 and 64 are electrically connected to each other and electrodes 63 and 65 are electrically connected to each other so as to form two sets of transfer electrodes driven by signals $\phi H1$ and $\phi H2$. Channels under horizontal CCD 41 are used as charge paths in the operation of transferring charges between horizontal CCDs 41 and 42.

Figure 4:
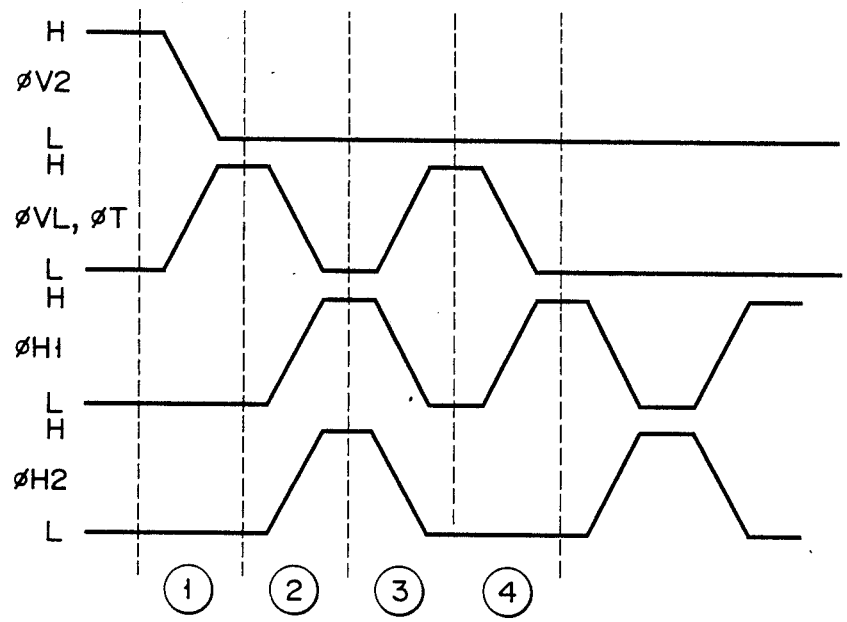
FIG. 4 is a waveform diagram showing the operation the horizontal register section of FIG. 2.

Numerals ① to ④ in FIG. 2 indicate the movement of signal charges 71 and 72 in the charge transferring operation and correspond to times t1 to t4 of FIG. 4. Signal charges 71 and 72 are transferred from electrode 56 to electrodes 53 and 54 at time t1 and from electrodes 53 and 54 to horizontal CCD 41 at time t2. At times t3 and t4, signal charge 71 is stored in horizontal CCD 41 by the element isolation region. In contrast, signal charge 72 is transferred to electrode (55) at time t3 and to horizontal CCDs 42 at time t4. In this way, signal charges from the adjacent vertical CCDs are separately supplied into two horizontal CCDs 41 and 42.

In this invention, as shown in FIG. 2, channel 80 acting as a signal charge path at the time of transferring signal charges between horizontal CCDs 41 and 42 is formed such that a portion thereof on the signal charge output port side (electrode 55) is made wider than that on the input port side (electrodes 53 and 54). That is, electrode 61 over channel 80 is formed of the second layer electrode and is broaden toward the output port side, so that channel 80 will be provided in the form corresponding to the divergent form of electrode 61 on horizontal CCD 41.

As shown in FIG. 2, since channel 80 is formed to be wider in a direction in which signal charge 72 is transferred between horizontal CCDs 41 and 42, a potential gradient may be created in channel 80 such that the potential on the side of electrode 55 is higher than on the side of electrodes 53 and 54. Therefore, the charges at times t2 and t3 can be transferred at a higher speed.

Figure 5:
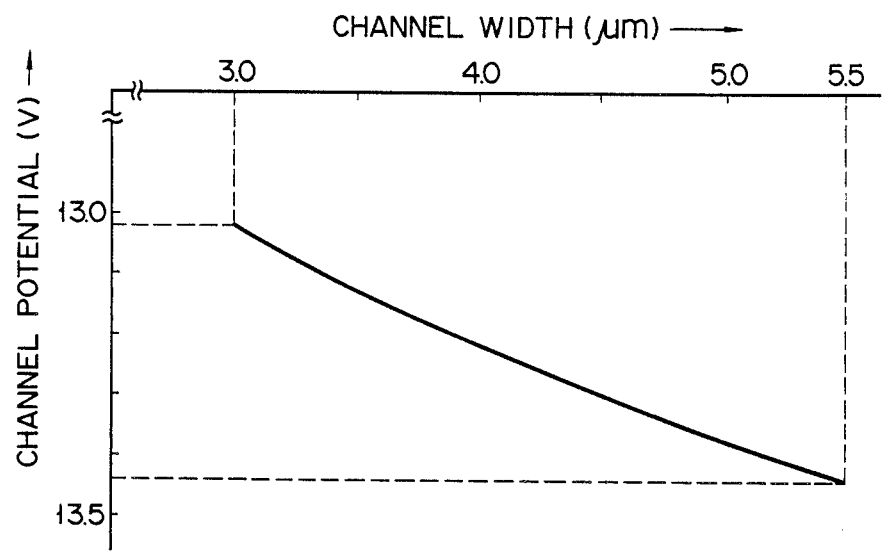
FIG. 5 is a diagram showing the relation between channel potential and the channel width.

FIG. 5 shows variation in the channel potential in a case where the width of channel 80 is changed from 3 $\mu$m to 5.5 $\mu$m with the central value thereof being 4 $\mu$m. As shown in FIG. 5, a difference between the potentials for the channel widths of 3 $\mu$m and 5.5 $\mu$m is approximately, 420 mV. When the length of channel 80 in the vertical direction is 15 $\mu$m, the potential gradient is 28 mV/$\mu$m. The potential pocket caused by burrs or indentations of electrode 61 occur in the channel having the above-described potential gradient, and in this case, the potential pocket is introduced in the potential slope. Therefore, the magnitude of the potential pocket can be substantially reduced by an amount corresponding to the potential gradient. As a result, the potential pocket of 50 mV caused in the conventional structure can be effectively reduced to 22 mV which is lower than the thermal excitation voltage of electrons, thus making it possible to completely transfer signal charges.

According to the above embodiment, the width of electrode 61 formed over the channel is made wider on the signal charge output port side than on the signal charge input port side, and therefore the potential of channel 80 through which the signal charges pass at the time of transferring the signal charges between horizontal CCDs 41 and 42 is higher on the output port side than on the input port side. As a result, the signal charges can be rapidly transferred between horizontal CCDs 41 and 42 and the potential pocket caused by the burrs or indentations of electrode 61 can be compensated for by the potential gradient. Therefore, the signal charges between the horizontal CCDs can be completely transferred, so that picture degradation due to vertical lines can be previously prevented, thus making it possible to produce good pictures. This invention can be easily attained by variously changing the width of electrode 61 in the signal charge transfer direction without modifying the basic construction of the solid state image sensor.

Figure 6:
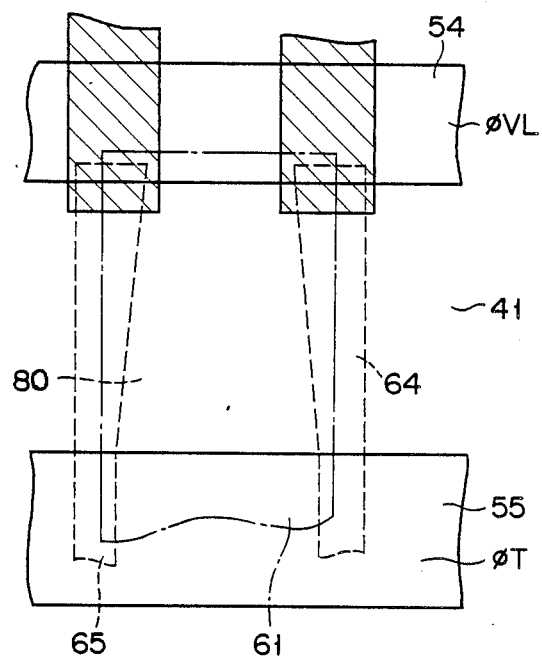
FIG. 6 is an enlarged diagram of a horizontal section obtained by modifying the horizontal section of FIG. 2.

FIG. 6 is a plan view showing the construction of a main portion of another embodiment of this invention. In FIG. 6, electrodes 64 and 65 are formed of the second layered polysilicon layer and electrode 61 on the channel is formed of the third layered polysilicon layer. In this embodiment, the shape of channel 80 is made equal to that portion of horizontal CCD 41 which is not covered with second layered electrodes 64 and 65, and the shape of electrode 61 is not limited if third layered electrode 61 is formed to cover the entire portion of channel 80. With this construction, channel 80 has a shape such that the output port thereof becomes wider toward the input port in the direction of signal charge transfer between horizontal CCDs 41 and 42, whereby the same effect as that of the former embodiment can be attained.

Figure 7:
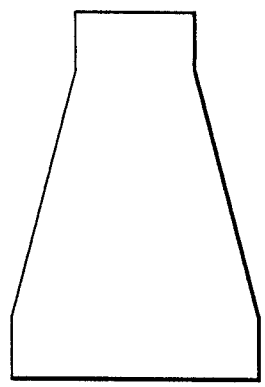
FIG. 7 is a plan view of a modified channel region of the horizontal register section of FIG. 2.

In the above embodiment, channel 80 is formed in the shape of trapezoid whose width increases at a constant rate in the vertical direction. In this case, fringe electric fields are created near the signal charge input and output ports of channel 80 by the presence of electrodes 53 and 54 and electrode 55. In order to solve this problem, it is possible to keep constant the width of channel 80 near the signal charge input and output ports of channel 80 and change the width (width of the electrode) of the central portion of channel 80 as shown in FIG. 7. Further, the rate of variation in the width can be changed and the channel width can be changed only in the central portion thereof.

Figure 8:
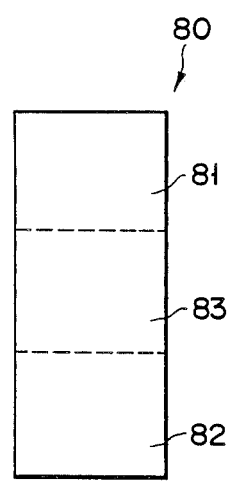
FIG. 8 is another modified plan view of a channel region of the horizontal register section of FIG. 2 in which different amounts of impurity are doped.

Instead of changing the channel width, the kind and amount of impurity to be doped into the channel region may be controlled so that different potentials are produced in the channel. For example, as shown in FIG. 8, boron (B) is doped into signal charge input port 81 of channel 80 at an impurity concentration of approximately $5 \times 10^{15}$ to $1 \times 10^{16}$/cm$^3$ and phosphorus (P) or arsenic (As) is doped into output port 82 at the same impurity concentration of boron (approximately $5 \times 10^{15}$ to $1 \times 10^{16}$/cm$^3$). Boron has a property for lowering a potential and phosphorus and arsenic have a property for raising a potential. Therefore, it is possible to set the channel potential of the output port higher than that of the input port with different kinds of impurities being doped into the input and output ports of the channel. Further, it is possible to change the channel potentials with the same type of impurity being doped at different impurity concentration into the channel.

In this case, phosphorus (P) is doped into the whole area of channel 80 at an impurity concentration of $1.1 \times 10^{17}$ cm$^{-3}$, and then boron (B) is doped into regions 81 and 83 at impurity concentrations of $1 \times 10^{16}$ cm$^{-3}$ and $5 \times 10^{15}$ cm$^{-3}$, respectively. The region 82 contains no boron.

As described above, amount of impurity to be doped is selectively set without channel width so that the channel potential has a desired gradient in a signal charge transfer direction thus attaining the object of this invention.

Figure 9:
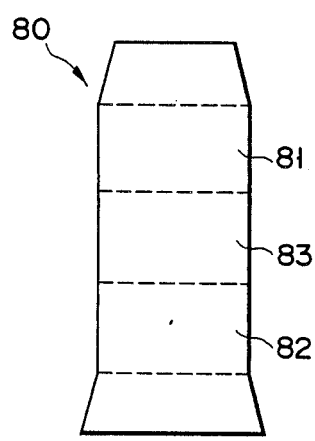
FIG. 9 is a plan view of still another modified channel region of the horizontal register section of FIG. 2 in which different amounts of impurity are doped and the divergent shape is used.

In addition to selective setting of the kind or concentration of impurity to be doped, the channel shape may be changed in order to obtain the potential gradient of the channel. For example, as shown in FIG. 9, the width of channel 80 is made wider towards the output port on the input port side, kept constant in the central portion thereof, and is made wider towards the output end on the output port side. The central region includes a boron doping area, a channel basic area and a phosphorus or arsenic doping area. A combination of the above shape of the channel and the selected kind of impurity makes it possible to create a desired potential gradient in channel 80.

Figure 10A:
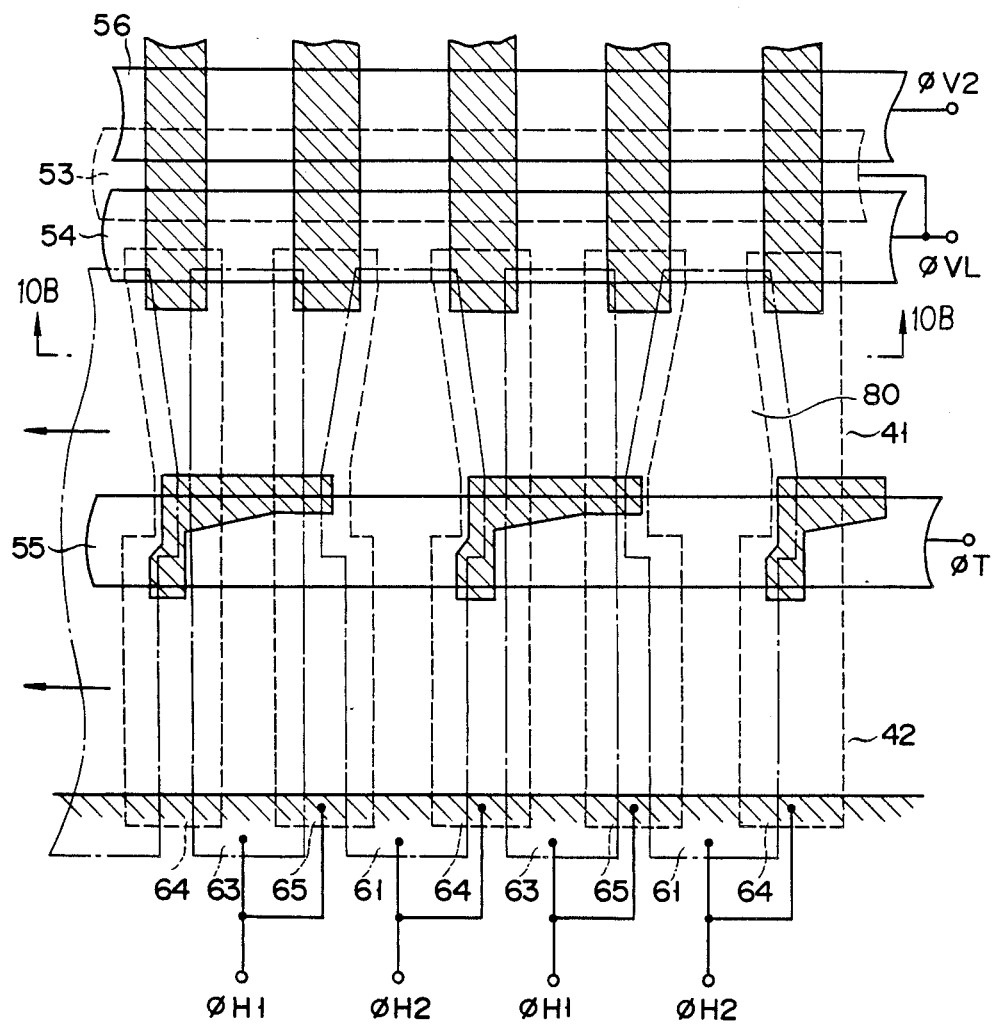
FIG. 10A is an enlarged view of another modification of the horizontal register section.

In the embodiment of FIG. 2, electrodes 64 and 65 are formed in the rectangular shape, and it is preferable to form the electrodes in the shape in conformity with the tapered or divergent shape of channel 80 as shown in FIG. 10A. With such shape, the capacitor formed between the electrodes and the channels can be balanced in the entire area, whereby the CCD driving speed is enhanced.

According to the device of FIG. 10A, electrodes 64 and 65 are formed of second layers, while electrodes 61 and 63 are formed of third layers, as shown in FIG. 10B. In this case, electrodes 64 and 65 are formed over channel regions (n-type regions having an impurity concentration of $1.0 \times 10^{17}$ cm$^{-3}$), while electrodes 61 and 63 are formed over channel regions (n+-type regions having an impurity concentration of $1.20 \times 10^{17}$ cm$^{-3}$).

In the above embodiments, the 2-line-electrode type horizontal CCD structure is used, but it is also possible to use 3-line or more line type horizontal CCDs and apply this invention to channels through which charges pass at the time of charge transfer between the horizontal CCDs.

As described above, according to this invention, the gradient of a charge potential is obtained which is higher in the signal charge output port than in the signal charge input port of the channel between the horizontal CCDs into which the signal charges supplied via the vertical CCDs are distributed. Therefore, the potential pocket caused by the burrs formed at the periphery of the electrode holds no charge. In other words, the charges are completely transferred so that good reproduction pictures free from degradation due to irregular vertical lines can be obtained.

Now, another embodiment of this invention is explained with reference to FIG. 11.

FIG. 11 shows the construction of a portion including horizontal CCD registers of a solid state image sensor having the same construction as that shown in FIG. 1. In FIG. 11, horizontal CCD register 145 (corresponding to horizontal CCD register 41 in FIG. 1) is connected to the end portion of vertical CCD register 143 (corresponding to vertical CCD registers $30_1$ to $30_n$ in FIG. 1) via vertical final-stage gate 147 (corresponding to electrodes 53 and 54 in FIG. 1), and horizontal transfer gate 146 (corresponding to electrode 55 in FIG. 1) is arranged between horizontal CCD registers 144 and 145. Further, horizontal transfer gates 151 and 152 are formed on horizontal CCD registers 144 and 145, and channel stopper 148 is formed to extend to gate 147.

Gate electrodes 146 and 147 are formed of first layered polysilicon, gate electrodes 151 and 153 are formed of second layered polysilicon and gate electrode 152 is formed of third layered polysilicon.

In the CCD image sensor having 2-line horizontal CCD registers, signal charges transferred from every other vertical CCD registers are separately supplied to horizontal CCD registers 144 and 145 in such a manner as described in the former embodiment, and thus transferred to the left in the drawing.

As shown in FIGS. 12 and 13, according to this embodiment, p-type impurity is doped into a channel region under horizontal transfer electrode 152 via horizontal transfer electrodes 151 and 153 in a self-alignment manner to form n-type region 155 in channel region 144. Region 155 into which p-type impurity is doped or n-type region 155 is formed to have a larger p-type impurity doping width at the front end portion of the channel (input port for signal charges: on the side of electrode 147) and a smaller p-type impurity doping width at the terminal or rear end portion of the channel (output port for signal charges: on the side of electrode 146). That is, region 155 is formed to become gradually narrower from the front end portion of the channel towards the rear or terminal end portion.

As shown in FIG. 12, if n-type region 155 is formed in channel region 144, the width of n-type region 155 occupied in channel region 144 is smaller towards the right direction in the drawing. Since the n-type region is narrower, the maximum potential of the channel is gradually higher. That is, as shown in FIG. 14, the channel potential under gate electrode 152 is gradually higher along the lengthwise direction of the channel. In this way, the intensity of electric field caused by the channel potential under gate electrode 152 can be made gradually higher, preventing occurrence of potential pockets or barriers.

As described above, according to this invention, since the channel potential can be higher in the rear or terminal end portion of the channel than in the front end portion thereof by selective doping of p-type impurity, signal charges can be transferred between horizontal CCD registers 144 and 145 at a higher speed and influence of potential pockets or barriers caused by irregularity of the side surfaces of the electrode can be cancelled by the potential gradient. Therefore, it is possible to completely transfer signal charges at the time of charge transfer between the horizontal CCD registers and degradation of the picture quality can be prevented so that good pictures can be reproduced. Further, this invention can be easily realized simply by selectively doping impurity in the channel without modifying the basic construction of the solid state image sensor.

Impurity doping region 155 into which impurity is selectively doped in the channel can also be formed as shown in FIGS. 15, 16 and 17. That is, in FIG. 15, low impurity concentration region 155A is formed to become narrower in a stepwise fashion. In FIG. 16, low impurity concentration region 155B is formed such that the front end and rear end portions are positioned inside the respective front and rear end portions of electrode 152. In this example, the potentials of electrodes 146 and 147 are utilized, and therefore low impurity concentration region 155B is formed shorter than electrode 152. In FIG. 17, n-type impurity is doped into channel region 144 instead of forming the low impurity concentration region by doping p-type impurity so as to form high impurity concentration region 155C in a pattern which is reversed with respect to the pattern of the low impurity concentration region.

In a case where the channel is formed of an n-type buried channel or p-type surface channel, the width of a region into which p-type impurity is selectively doped is larger in the front end portion and smaller in the rear end portion, or the width of a region into which n-type impurity is selectively doped is smaller in the front end portion and larger in the rear end portion. Further, it is possible to combine the above two methods. In a case where the channel is formed of a p-type buried channel or n-type surface channel, the width of a region into which n-type impurity is selectively doped is larger in the front end portion and smaller in the rear end portion, or the width of a region into which p-type impurity is selectively doped is smaller in the front end portion and larger in the rear end portion. Further, it is possible to combine the above two methods.

This invention is not limited to the channel used for transferring signal charges between the horizontal CCD registers and can also be applied to a channel in which a long gate is used. FIGS. 18A to 19B illustrate the embodiments in which the invention is applied to a vertical register. According to the embodiment of FIGS. 18A and 18B, the channel of the vertical register is formed of a plurality of channel regions 90 each having an n-type triangular section 91 and an n$^-$-type triangular section 92. Gate electrodes 93 and 94 are formed over the channel regions 90, respectively.

In the embodiment of FIGS. 19A and 19B, the channel of the vertical register is formed of an n-type channel region 95 and a double channel region 96 having an n$^-$-type section 96$a$ and an n-type section 96$b$. Gate electrodes 97 and 98 are formed over the channel regions 95 and 96, respectively. In the above embodiments, it is of course possible to repeatedly effect the ion-implanting processes. Also, electrons are dealt as carriers and the channel potential of the signal charge input port area is higher than that of the output port area. However, in a case where holes are used as carriers, the above potential relation should be reversed.

According to the embodiments described above, the intensity of electric field caused by the channel potential can be enhanced in the entire portion of the channel region by selectively doping impurity into the channel region of the CCD register section. Therefore, even if the charge transfer gate is long, the intensity of electric field caused by the channel potential can be enhanced in the entire portion of the channel region and occurrence of potential pockets and barriers can be prevented. As a result, the efficiency of transferring signal charges can be enhanced.

What is claimed is:

1. A solid image sensor, comprising:
   charge storage means having a plurality of light receiving elements arranged in columns and rows on a semiconductor substrate;
   a plurality of vertical charge transfer means arranged in parallel in a column direction along the columns of said light receiving elements of said charge storage means, for vertically transferring signal charges supplied from said charge storage means; and
   horizontal charge transfer means, for receiving signal charges supplied from said vertical charge transfer means and transferring the signal charges in a horizontal direction;
   wherein at least one of said horizontal and vertical charge transfer means has a charge input port, a charge output port and a channel region in which a potential is higher on the charge output port side than on the charge input port side so that all signal charge is transferred across the channel to said output port; and
   wherein said horizontal charge transfer means includes a plurality of horizontal registers which are arranged in parallel in a horizontal direction and respectively have channel regions through which the signal charges pass, said channel regions including first conductivity type impurity in the charge input port and second conductivity type impurity in the output port.

2. A solid state image sensor according to claim 1, wherein the first conductivity type impurity is boron and the second conductivity type impurity is arsenic or phosphorus.

3. A solid state image sensor according to claim 2, wherein the boron and arsenic or phosphorus impurity concentrations are $5 \times 10^{15}$ to $1 \times 10^{16}$/cm$^3$.

4. A solid state image sensor, comprising:
   charge storage means having a plurality of light receiving elements arranged in columns and rows on a semiconductor substrate;
   a plurality of vertical charge transfer means arranged in parallel in a column direction along the columns of said light receiving elements of said charge storage means, for vertically transferring signal charges supplied from said charge storage means; and
   horizontal charge transfer means, for receiving signal charges supplied from said vertical charge transfer means and transferring the signal charges in a horizontal direction;
   wherein at least one of said horizontal and vertical charge transfer means has a charge input port, a charge output port and a channel region in which a potential is higher on the charge output port side than on the charge input port side so that all signal charge is transferred across the channel to said output port; and
   wherein said channel region includes a divergent input port area, a central area and a divergent output port area, said central area including at least two different impurity regions.

5. A solid state image sensor, comprising:
   charge storage means having a plurality of light receiving elements arranged in columns and rows on a semiconductor substrate;
   a plurality of vertical charge transfer means arranged in parallel in a column direction along the columns of said light receiving elements of said charge storage means, for vertically transferring signal charges supplied from said charge storage means; and
   horizontal charge transfer means, for receiving signal charges supplied from said vertical charge transfer means and transferring the signal charges in a horizontal direction;
   wherein at least one of said horizontal and vertical charge transfer means has a charge input port, a charge output port and a channel region in which a potential is higher on the charge output port side than on the charge input port side so that all signal charge is transferred across the channel to said output port; and
   wherein said channel region includes a rectangular input port area, a divergent central area and a rectangular output port area.

6. A solid state image sensor comprising:
   charge storage means having a plurality of light receiving elements arranged in columns and rows on a semiconductor substrate;
   a plurality of vertical charge transfer means arranged in parallel in a column direction along the columns of said light receiving elements of said charge storage means, for vertically transferring signal charges supplied from said charge storage means; and
   horizontal charge transfer means, for receiving signal charges supplied from said vertical charge transfer means and transferring the signal charges in a horizontal direction;
   wherein said horizontal charge transfer means has a charge input port and a charge output port, and a channel region formed by ion-implanting first conductivity type or second conductivity type impurity into a portion of said channel region between said charge input port and charge output port, said ion-implanted portion having a width gradually changing between said charge input port and charge output port.

7. A solid state image sensor according to claim 6, wherein said ion-implanted portion has a width which becomes gradually narrower.

8. A solid state image sensor according to claim 6, wherein said ion-implanted portion has a width which becomes stepwise narrower.

9. A solid state image sensor according to claim 6, wherein said ion-implanted portion is formed within an area limited by both ends of said channel region.

10. A solid state image sensor according to claim 6, wherein said channel region comprises an n-type buried channel or p-type surface channel, and said ion-implanted portion comprises a p-type impurity region which is wider at the charge input port than at the charge output port.

11. A solid state image sensor according to claim 6, wherein said channel region comprises an n-type buried channel or p-type surface channel, and said ion-implanted portion comprises an n-type impurity region which is narrower at the charge input port than at the charge output port.

12. A solid state image sensor according to claim 6, wherein said channel region comprises a p-type buried channel or an n-type surface channel and said ion-implanted portion comprises an n-type impurity region which is wider at the charge input port than at the charge output port.

13. A solid state image sensor according to claim 6, wherein said channel region comprises a p-type buried channel or an n-type surface channel, and said ion-implanting portion comprises a p-type impurity region which is narrower at the charge input port than at the charge output port.

14. A solid state image sensor comprising:
charge storage means having a plurality of light receiving elements arranged in columns and rows on a semiconductor substrate;
a plurality of vertical charge transfer means arranged in parallel in a column direction along the columns of said light receiving elements of said charge storage means, for vertically transferring signal charges supplied from said charge storage means; and
horizontal charge transfer means, for receiving signal charges supplied from said vertical charge transfer means and transferring the signal charges in a horizontal direction;
wherein said horizontal charge transfer means has a charge input port and a charge output port; a channel region formed in a divergent configuration so as to set a potential of said charge output port higher than that of said charge input port; a first electrode formed on said channel region in a configuration corresponding to the configuration of said channel region; and a second electrode formed on said channel region in a configuration corresponding to the configuration of said channel region so as to function as a barrier.

15. A solid state image sensor comprising:
charge storage means having a plurality of light receiving elements arranged in columns and rows on a semiconductor substrate;
a plurality of vertical charge transfer means arranged in parallel to the columns of said light receiving elements of said charge storage means, for vertically transferring signal charges supplied from said charge storage means; and
a plurality of horizontal charge transfer means, for receiving signal charges supplied from said vertical charge transfer means and transferring the signal charges in a horizontal direction;
wherein at least one of said horizontal and vertical charge transfer means has a charge input port and a charge output port and a channel region in which the potential is higher on the charge output port side than on the charge input port side, and said horizontal charge transfer means includes a plurality of horizontal registers which are arranged in parallel in a horizontal direction and have channel regions through which the signal charges pass, said channel regions including at least one of a first conductivity type impurity in the charge input port and a second conductivity type impurity in the charge output port.

16. A solid state image sensor according to claim 15, wherein the first conductivity type impurity is boron and the second conductivity type impurity is arsenic or phosphorus.

17. A solid state image sensor according to claim 16, wherein the boron and arsenic or phosphorus impurity concentrations are $5 \times 10^{15}$ to $1 \times 10^{16}/cm^3$.

18. A solid state image sensor comprising:
charge storage means having a plurality of light receiving elements arranged in columns and rows on a semiconductor substrate;
a plurality of vertical charge transfer means arranged in parallel to the columns of said light receiving elements of said charge storage means, for vertically transferring signal charges supplied from said charge storage means; and
a plurality of horizontal charge transfer means, for receiving signal charges supplied from said vertical charge transfer means and transferring the signal charges in a horizontal direction;
wherein at least one of said horizontal and vertical charge transfer means has a charge input port and a charge output port and a channel region in which the potential is higher on the charge output port side than on the charge input port side, and said channel region includes a divergent input port area, a central area and a divergent output port area, said central area including at least two different impurity regions.

19. A solid state image sensor according to claim 18, wherein said channel region includes an area in which boron is doped on the input port side thereof.

20. A solid state image sensor according to claim 18, wherein said channel region includes an area in which arsenic or phosphorus is doped on the output port side thereof.

21. A solid state image sensor comprising:
charge storage means having a plurality of light receiving elements arranged in columns and rows on a semiconductor substrate;
a plurality of vertical charge transfer means arranged in parallel to the columns of said light receiving elements of said charge storage means, for vertically transferring signal charges supplied from said charge storage means; and a plurality of horizontal charge transfer means, for receiving signal charges supplied from said vertical charge transfer means and transferring the signal charges in a horizontal direction;

wherein at least one of said horizontal and vertical charge transfer means has a charge input port and a charge output port and a channel region in which the potential is higher on the charge output port side than on the charge input port side, and said channel region includes a rectangular input port area, a divergent central area and a rectangular output port area.

22. A solid state image sensor according to claim 21, wherein said channel region includes an area in which boron is doped on the input port side thereof.

23. A solid sate image sensor according to claim 21, wherein said channel region includes an area in which arsenic or phosphorus is doped on the output port side thereof.

24. A solid state image sensor, comprising:

charge storage means having a plurality of light receiving elements arranged in columns and rows on a semiconductor substrate;

a plurality of vertical charge transfer means arranged in parallel to the columns of said light receiving elements of said charge storage means, for vertically transferring signal charges supplied from said charge storage means; and horizontal charge transfer means, for receiving signal charges supplied from said vertical charge transfer means and transferring the signal charges in a horizontal direction;

wherein said horizontal charge transfer means contains a plurality of horizontal registers arranged in parallel in the horizontal direction and having channel regions, each channel region having a charge input port and a charge output port, and a portion of said channel region within each of said channel regions of said horizontal registers is used for transferring the signal charges between said horizontal registers, and has a potential gradient where the potential at the charge output port is higher than at the charge input port; and wherein said horizontal charge transfer means includes a plurality of horizontal registers which are arranged in parallel in a horizontal direction and have channel regions through which the signal charges pass, said channel regions including at least one of a first conductivity type impurity in the charge input port and a second conductivity type impurity in the charge output port.

* * * * *